(12) United States Patent
Madan

(10) Patent No.: US 8,296,628 B2
(45) Date of Patent: Oct. 23, 2012

(54) DATA PATH READ/WRITE SEQUENCING FOR REDUCED POWER CONSUMPTION

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 533 days.

(21) Appl. No.: 12/699,357

(22) Filed: Feb. 3, 2010

(65) Prior Publication Data

US 2011/0035644 A1    Feb. 10, 2011

Related U.S. Application Data

(60) Provisional application No. 61/158,182, filed on Mar. 6, 2009.

(51) Int. Cl.
*G11C 29/00* (2006.01)
(52) U.S. Cl. ........................................................ 714/773
(58) Field of Classification Search .................... 714/773
See application file for complete search history.

(56) References Cited

U.S. PATENT DOCUMENTS

| | | | | |
|---|---|---|---|---|
| 5,610,872 A | * | 3/1997 | Toda | 365/230.06 |
| 5,654,912 A | * | 8/1997 | Hasegawa et al. | 365/149 |
| 6,867,997 B2 | * | 3/2005 | Komatsuzaki | 365/145 |
| 7,123,501 B2 | * | 10/2006 | Noda | 365/145 |
| 2003/0174555 A1 | * | 9/2003 | Conley et al. | 365/200 |
| 2009/0273961 A1 | * | 11/2009 | Ono et al. | 365/51 |

* cited by examiner

*Primary Examiner* — Stephen M Baker
(74) *Attorney, Agent, or Firm* — Rose Alyssa Keagy; Wade J. Brady, III; Frederick J. Telecky, Jr.

(57) ABSTRACT

A solid-state memory such as a ferroelectric random access memory (FeRAM) with multiplexed internal data bus and reduced power consumption on data transfer. The memory stores data in the form of multi-byte data words with error correction coding (ECC). In a page mode read/write operation, data states stored in memory cells of the selected row are sensed by sense amplifiers arranged in first and second banks, which are associated with first and second groups of columns. The first bank of sense amplifiers, associated with the first group of columns and containing the ECC value, are coupled to to the internal bus, followed by coupling the second bank of sense amplifiers associated with the second group of columns to the internal bus. The internal bus is then placed in tri-state, following which the internal data bus is driven with data to be written into the second group of columns in that same row, that data latched into the second bank of sense amplifiers. The internal bus is then driven with the data to be written to the first group of columns in the row, and latched into the first bank of sense amplifiers. To the extent that the data in the second group of columns does not change from the read to write operations, power consumption otherwise necessary for switching the internal bus is avoided.

32 Claims, 6 Drawing Sheets

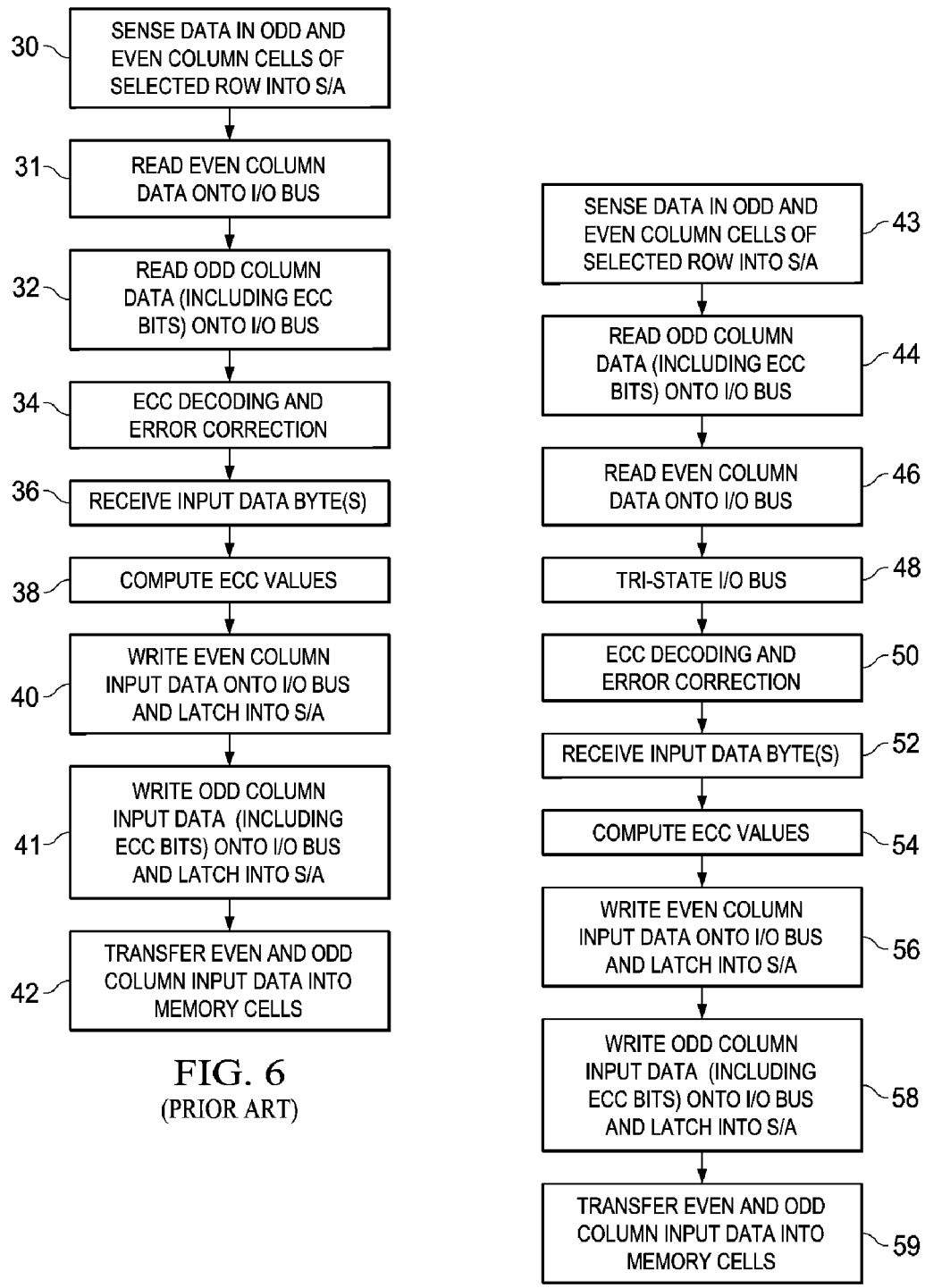

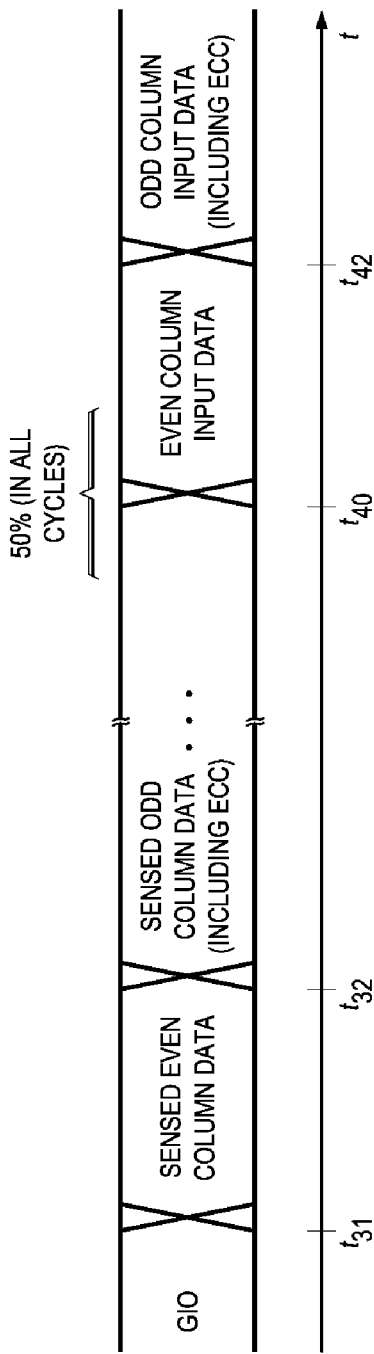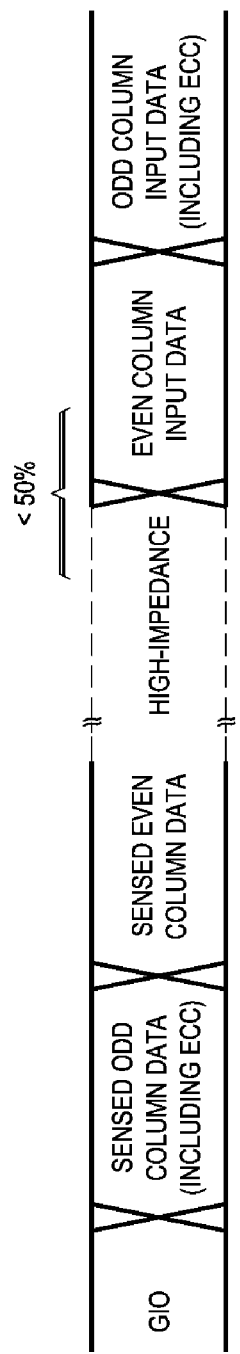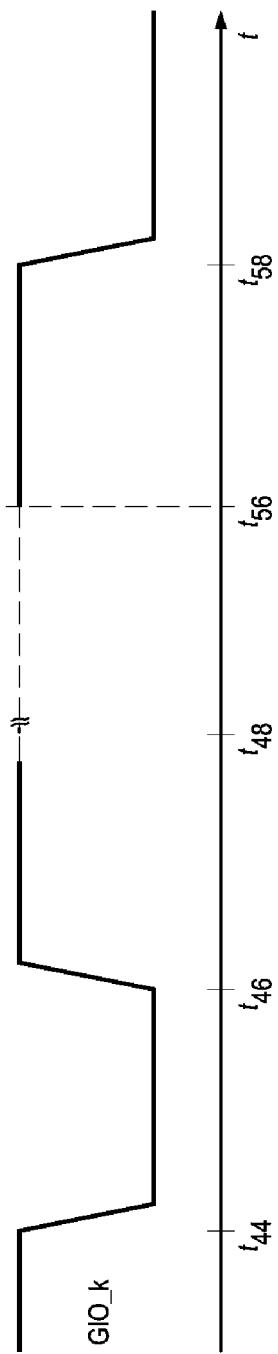
FIG. 8a (PRIOR ART)
FIG. 8b
FIG. 8c

DATA PATH READ/WRITE SEQUENCING FOR REDUCED POWER CONSUMPTION

CROSS-REFERENCE TO RELATED APPLICATIONS

This application claims priority, under 35 U.S.C. §119(e), of Provisional Application No. 61/158,182, filed Mar. 6, 2009, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory as realized in semiconductor integrated circuits. Embodiments of this invention are more specifically directed to the operation of data paths in such memories in read and write access operations.

Many modern electronic devices and systems now include substantial computational capability for controlling and managing a wide range of functions and useful applications. Many of these electronic devices and systems are now portable or handheld devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. An important class of mobile devices are implantable medical devices, such as pacemakers, defibrillators, and the like. In each of these cases, these systems and devices must be battery powered to in fact be mobile. The power consumption of the electronic circuitry in those devices and systems is therefore of great concern, as battery life is often a significant factor in the buying decision as well as in the utility of the device or system.

Many mobile devices, including implantable medical devices, now rely on solid-state memory not only for data storage during operation, but also as non-volatile memory for storing program instructions (e.g., firmware) and for storing the results and history of previous operations and calculations. Electrically-erasable programmable read-only memory (EEPROM) is a common type of solid-state non-volatile memory, particularly EEPROM of the "flash" type. Ferroelectric random-access memory (FeRAM) is a popular non-volatile solid-state memory technology, particularly in implantable medical devices. Modern mobile devices typically include substantial non-volatile memory capacity, often amounting to as much as one or more gigabytes.

As mentioned above, power consumption of integrated circuit functions is an important concern in the design and manufacture of mobile electronic devices and systems. The miniaturization of these integrated circuit functions is also an important design goal, whether to minimize manufacturing cost or to provide a minimum form factor. Given the substantial memory capacity now required by these computationally sophisticated, the chip area involved in realizing solid-state memory, particularly non-volatile solid-state memory is a large portion of the overall chip area.

According to conventional techniques, one approach to reducing chip area in solid-state memory, particularly non-volatile memory such as FeRAM, is to time-multiplex the communication of data words along internal buses. As known in the art, "page mode" access involves the accessing of a row of memory cells, from which successive data elements (e.g., bytes) can be rapidly retrieved or written. Page-mode access enables error-correction coding (ECC) to be applied over the row as a whole, rather than on a byte-by-byte basis, resulting in fewer additional memory cells for storing the ECC code bits to achieve a given level of error correction. For example, ECC can be performed using six code bits over four payload bytes (a data word of thirty-two payload bits) rather than four code bits per byte, which requires fewer code bits (six bits vs. sixteen bits for each data word) in the memory. The chip area for implementing this page mode and row-wide ECC approach can be reduced by time-multiplexing the data communications on using an internal data bus that is narrower than the number of bits in the accessed row. If six code bits are used for a four-byte payload, the entire row is thirty-eight bits wide; 2× internal multiplexing would reduce the internal bus width from thirty-eight conductors to nineteen conductors (for differential signals, from seventy-six to thirty-eight conductors), reducing the chip area requirements by one-half for this internal bus. In some memories, multiple "segments" of the array are accessed by way of the internal bus, in which case the reduction in chip area is especially substantial.

However, as mentioned above, power consumption by the memory is also of great concern in these solid-state memories, particularly if implemented in mobile or implantable devices and systems. In the context of the time-multiplexed internal bus, the chip area savings comes at a cost of increased switching rates on the internal bus, such increased switching rates reflected in increased power consumption by the memory function itself.

BRIEF SUMMARY OF THE INVENTION

Embodiments of this invention provide a memory and method of operating the same that results in reduced power consumption during active page-mode operation of solid-state memory.

Embodiments of this invention provide such a memory and method in which reduced power consumption is attained with no significant increase in chip area.

Embodiments of this invention provide such a memory and method compatible with the application of error-correction coding.

Embodiments of this invention provide such a memory and method suitable for a memory organization in which multiple array portions are arranged in multiple row address sectors, and in multiple column segments.

Other objects and advantages of this invention will be apparent to those of ordinary skill in the art having reference to the following specification together with its drawings.

Embodiments of this invention may be implemented in a ferroelectric random access memory (FeRAM) arranged in one or more array blocks, in which a row of the array block includes additional columns for storing error correction coding (ECC) data. Two or more banks of sense amplifiers are associated with each array block, with one of the sense amplifier banks operable at a time to forward its sensed data to an internal data bus. In page mode operation along a row of the memory array block, both sense amplifier banks read the memory cells in the selected row and in their associated columns. The first sense amplifier bank forwards its sensed data, including the data from the additional ECC code bit columns, to the internal data bus, after which the second sense amplifier bank forwards the sensed data from its associated columns to the internal data bus. The internal data bus is then placed in a "tri-state" (or high-impedance) state, after which data to be written are forwarded first to the second sense amplifier bank from the internal data bus, followed by forwarding the payload and ECC data to the first sense amplifier block from the internal data bus. The write operation is completed upon both sense amplifier banks applying the data to the memory cells in the selected row. The power consumed by switching the internal data bus is reduced by allowing the internal data bus lines to float at their previously-read data state. To the extent that the contents are not changed when re-written, the power required to switch the internal data bus is minimized.

BRIEF DESCRIPTION OF THE SEVERAL VIEWS OF THE DRAWING

FIG. 6 is a flow chart illustrating the operation of a solid-state memory with internal data bus according to conventional methods.

FIG. 7 is a flow chart illustrating the operation of the memory of FIGS. 1 through 5 according to an embodiment of this invention.

FIG. 8a is a timing diagram illustrating the conventional operation of a memory with internal data bus as in FIG. 6.

FIGS. 8b and 8c are timing diagrams illustrating the operation of the memory constructed according to embodiments of this invention.

DETAILED DESCRIPTION OF THE INVENTION

The present invention will be described in connection with its preferred embodiment, namely as implemented into a non-volatile solid-state memory of the ferroelectric random access memory (FeRAM) type. However, it is also contemplated that this invention can provide important advantages and benefits in other realizations, such as semiconductor memories of any type, including volatile static and dynamic RAM. In addition, while this description illustrates a stand-alone memory architecture, it is also contemplated that this invention may be implemented in embedded memories within large-scale integrated logic circuits, such as microprocessors or integrated circuits referred to as a "system-on-a-chip". Accordingly, it is to be understood that the following description is provided by way of example only, and is not intended to limit the true scope of this invention as claimed.

Figure 1:
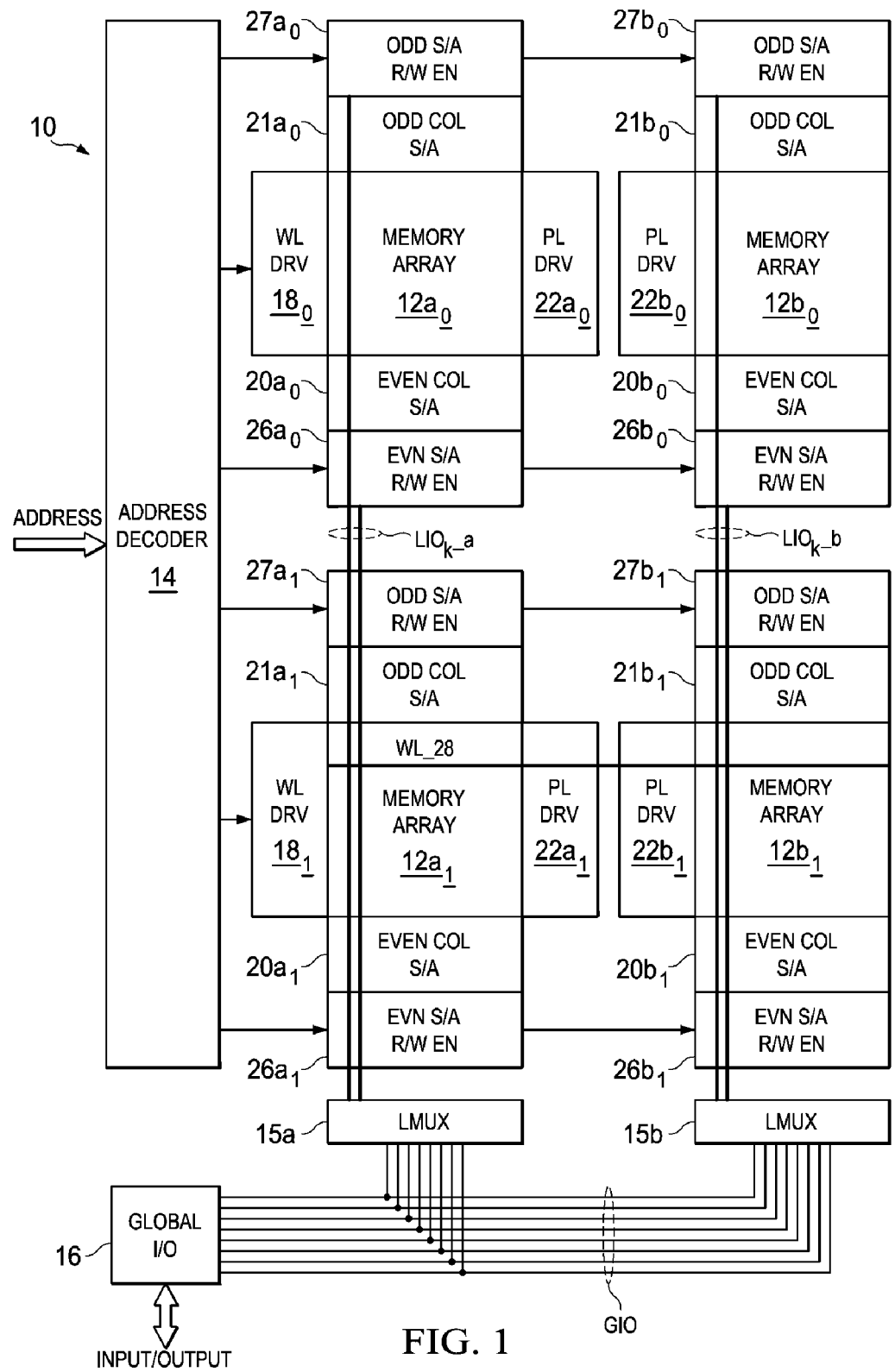
FIG. 1 is an electrical diagram, in block form, of a solid-state memory constructed according to an embodiment of this invention.

FIG. 1 illustrates the architecture of memory 10 constructed according to embodiments of this invention. In this example, memory 10 is shown as a stand-alone ferroelectric memory device (i.e., constructed as an FeRAM). As mentioned above, however, it is contemplated that memory 10 may alternatively be integrated into a large-scale logic device such as a microprocessor, single-chip microcomputer, or a so-called "system-on-a-chip". It is contemplated that those skilled in the art having reference to this specification will be readily able to realize memory 10 in such a larger-scale integrated circuit if desired, without undue experimentation.

In memory 10 as shown in FIG. 1, each memory cell is constructed as a conventional ferroelectric random access memory cell, and the memory cells are arranged in rows and columns within multiple memory array blocks 12. In the arrangement of FIG. 1, memory array blocks 12 are arranged into two sectors and two segments, the sectors and segments being orthogonal to one another. Memory array block $12a_0$ resides in sector "0" and segment "a"; memory array block $12a_1$ resides in sector "1" and segment "a"; memory array block $12b_0$ resides in sector "0" and segment "b"; and memory array block $12b_1$ resides in sector "1" and segment "b".

A memory address directed to memory 10 is received and decoded by address decoder 14, in this architecture of FIG. 1. As typical in the art, address decoder 14 considers the received address as having a row portion and a column portion. The row portion of the memory address selects a row of memory cells within memory 10, each row being within a single sector and multiple segments. The column portion of the memory address selects one or more columns of memory cells associated with a memory array block 12 within the selected sector of memory 10. Each column corresponds to a pair of complementary bit lines that are coupled to one or more memory cells in that column and in the selected row.

In this arrangement, memory array blocks $12a_0$ and $12b_0$ in sector "0" share word lines driven by word line driver $18_0$, each word line coupled to memory cells within an associated row, and selectable by address decoder 14 based on the row portion of the received address. Similarly, memory array blocks $12a_1$ and $12b_1$ in sector "1" share word lines driven by word line driver $18_1$. In each case, word lines driven by word line drivers $18_0$, $18_1$ effectively extend across all memory array blocks 12 that reside in the same sector, as shown by way of example by word line WL_28 in FIG. 1.

Conversely, memory array blocks $12a_0$, $12a_1$ in segment "a" share the same set of Local Input-Output (LIO) columns in an internal I/O bus in the data path of memory 10, as do memory array blocks $12b_0$, $12b_1$ in segment "b". In this example, each LIO column is constituted by a complementary pair of local input/output lines LIO that are coupled to complementary terminals of sense amplifiers 20, 21 of the associated memory array block 12, and to an associated local multiplexer (LMUX) bank 15. By way of example, FIG. 1 illustrates LIO column $LIO_{k\_a}$ associated with memory array blocks $12a_0$, $12a_1$ and local multiplexer bank 15a, and LIO column $LIO_{k\_b}$ associated with memory array blocks $12b_0$, $12b_1$ and local multiplexer bank 15b. In this embodiment of the invention, each memory array block 12 is associated with two banks of sense amplifiers: even column sense amplifier bank 20, and odd column sense amplifier bank 21 associated with even-numbered and odd-numbered columns, respectively, in that memory array block 12. Even column sense amplifier read/write enable bank 26 couples even column sense amplifiers 20 for a memory array block 12 to local I/O columns LIO, and odd column sense amplifier read/write enable bank 27 couples odd column sense amplifiers 21 for that memory array block 12 to local I/O columns LIO. Address decoder 14 generates control signals that enable either the even or odd column sense amplifier read/write enable circuits 26, 27 according to the desired timing within a memory access cycle, so that either only the even column sense amplifiers 20 or only the odd column sense amplifiers 21 are in communication with the local I/O columns LIO. As will be described in further detail below, local multiplexer bank 15a couples local I/O columns LIO for segment "a" to global input/output bus GIO; local multiplexer bank 15b similarly couples local I/O columns LIO for segment "b" to global input/output bus GIO. Memory array blocks $12a_0$, $12a_1$ in segment "a" share local multiplexer bank 15a, and memory array blocks $12b_0$, $12b_1$ in segment "b" share local multiplexer bank 15b. As will be described in further detail below, data contention on global I/O bus GIO is prevented by control logic enabling at most one of local multiplexer banks 15a, 15b at any given time in a memory cycle.

As mentioned above, memory 10 corresponds to an FeRAM type of memory. As such, memory array blocks $12a_0$, $12a_1$, $12b_0$, $12b_1$ are associated with plate line driver circuits $22a_0$, $22a_1$, $22b_0$, $22b_1$, respectively. Plate line driver circuits 22 apply the appropriate voltages to the plate electrodes of the selected FeRAM memory cells to carry out the desired read or write operation, as known in the art. Of course, memories of other technologies (e.g., static RAM, EEPROM) may not include such plate line driver circuits 22 as shown, or may include other alternative driver circuits for performing the desired operation.

Figure 2:
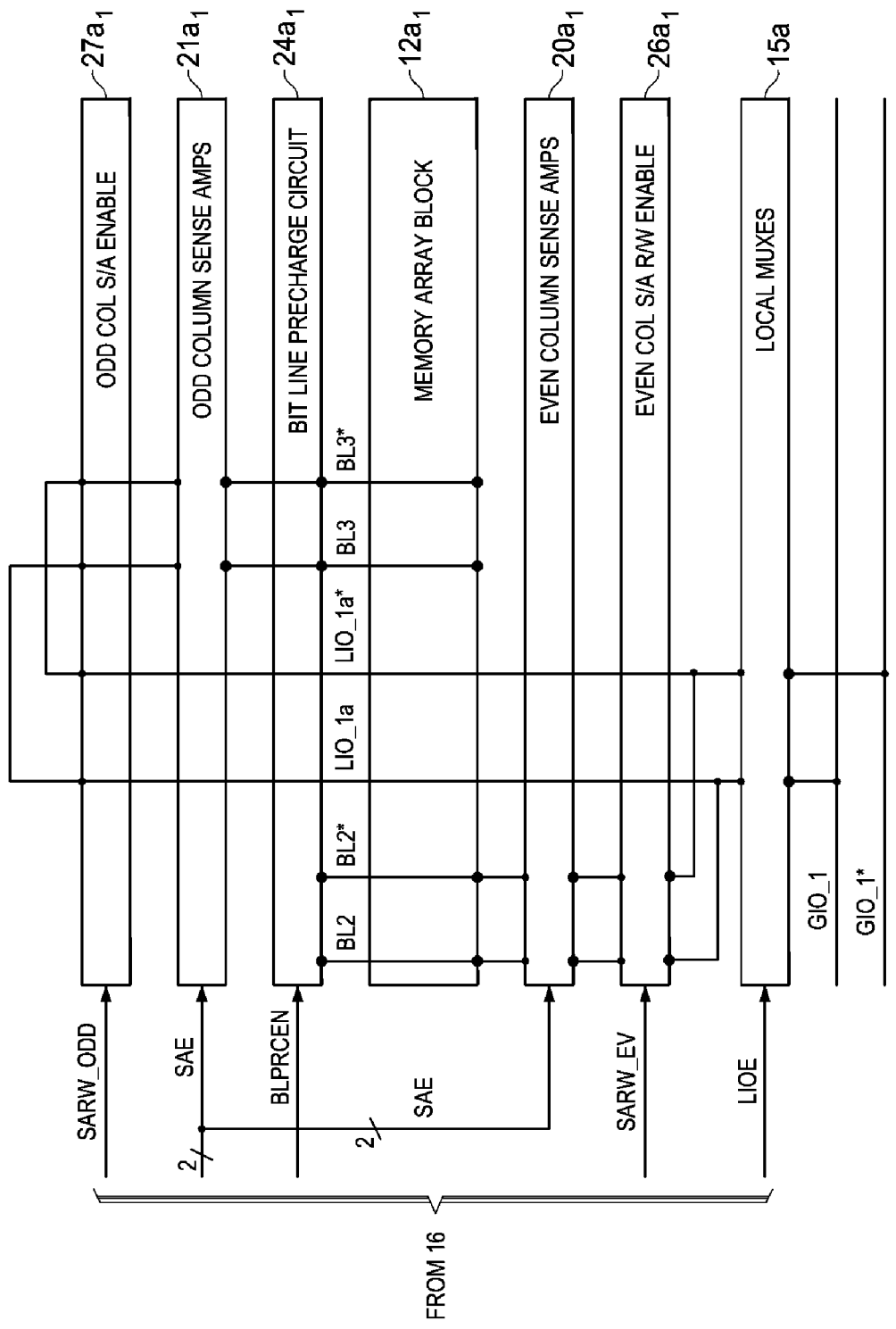
FIG. 2 is an electrical diagram, in block form, of a sector and segment of the memory array in the memory of FIG. 1, constructed according to embodiments of this invention.

FIG. 2 illustrates, in further detail, the architecture of memory array block $12a_1$ in memory 10 and its associated sense circuitry according to embodiments of this invention. This construction of memory array block $12a_1$ as shown in FIG. 2 is intended to be representative of the other memory array blocks 12 in this embodiment of the invention. Of course, variations and alternatives to this architecture and construction are also suitable for use in connection with embodiments of this invention, and as such the construction shown in FIG. 2 is by way of example only.

As shown in FIG. 2 and as mentioned above, memory array block $12a_1$ is associated with even column sense amplifier bank $20a_1$ and odd column sense amplifier bank $21a_1$, which sense the state of differential bit lines for even and odd numbered columns, respectively. The differential bit line pairs for two columns are illustrated in FIG. 2 by way of bit lines BL2, BL2* for column 2, and bit lines BL3, BL3* for column 3. All bit lines, including bit lines BL2, BL2*, BL3, BL3*, are connected to bit line precharge circuit $24a_1$, which simultaneously precharges the bit lines associated with memory array block $12a_1$ to a desired voltage prior to a sense operation in response to control signal BLPRCEN.

Bit lines BL2, BL2* are coupled to a sense amplifier in even column sense amplifier bank $20a_1$, and bit lines BL3, BL3* are coupled to a sense amplifier in odd column sense amplifier bank $21a_1$. Even and odd sense amplifier banks $20a_1$, $21a_1$ are each enabled by control signal SAE. The outputs from even column sense amplifier bank $20a_1$ are coupled to even column sense amplifier read/write enable circuit $26a_1$, which in turn selectively couples the sense amplifier output to local I/O lines LIO, LIO* (collectively referred to herein as local I/O bus LIO) in response to control signal SARW_EV. Similarly, outputs from odd column sense amplifier bank $21a_1$ are connected to odd column sense amplifier read/write enable circuit $27a_1$, which in turn selectively couples the sense amplifier output to local I/O lines LIO, LIO* in response to control signal SARW_ODD.

Each pair of local I/O lines LIO, LIO* is associated with a pair of columns in memory array block $12a_1$, according to embodiments of this invention. For example, as shown in FIG. 2, bit line pair BL2, BL2* and bit line pair BL3, BL3* are associated with the same pair of local I/O lines LIO_1a, LIO_1a* (i.e., the local I/O lines for pair 1, considering that columns 0 and 1 are associated with local I/O lines LIO_0a, LIO_0a*). To avoid data contention on local I/O lines LIO_1a, LIO_1a*, at most only one of even column sense amplifier read/write enable circuit $26a_1$ and odd column sense amplifier read/write enable circuit $27a_1$ is enabled in any memory cycle.

As described above in connection with FIG. 1, memory array blocks 12 are arranged in multiple segments in the column direction, such segments sharing global I/O bus GIO. In the example of FIG. 2, memory array block $12a_1$ is associated with local multiplexers 15a, which selectively couple local I/O lines LIO, LIO* to global I/O lines GIO, GIO* in response to control signal LIOE. In the example of columns 2 and 3 of memory array block $12a_1$ shown in FIG. 2, local multiplexers 15a couple local I/O lines LIO_1a, LIO_1a* to global I/O lines GIO_1, GIO_1*, respectively, along with the other local I/O lines associated with memory array block $12a_1$, in response to control signal LIOE. Alternatively, if only one segment of memory array blocks is realized, local I/O lines LIO, LIO* will be communicated directly to global I/O block 16 without local multiplexers 15, and will constitute the internal data bus. In any event, an internal data bus in memory 10 refers, in a generic sense, to data conductors and buses including either or both of local I/O lines LIO, LIO* and global I/O bus GIO exemplified by this embodiment of the invention.

Sense amplifier banks $20a_1$, $21a_1$ can also perform data write operations, or assist in writes, by amplifying a differential level applied to local I/O lines LIO, LIO*. To perform a data write, global I/O block 16 receives input data from external to memory 10, and applies corresponding data levels to global I/O lines GIO, GIO*. For a write to memory array block $12a_1$, local multiplexer bank 15a couples global I/O lines GIO, GIO* to local I/O lines LIO, LIO*. The differential level on local I/O/lines LIO, LIO* are coupled via even or odd column sense amplifier read/write enable circuits $26a_1$, $27a_1$, depending on the column address, to terminals (e.g., sense nodes) of even or odd column sense amplifiers $20a_1$, $21a_1$, respectively, for the addressed columns. When enabled by control signal SAE, sense amplifier banks $20a_1$, $21a_1$ may amplify this differential signal to perform or assist in the write operation to the cells in the selected row (which will be receiving the appropriate word line and plate line levels for the write). Alternatively, separate write circuitry may be provided to drive the bit lines to the desired differential levels to perform the write.

As shown in FIG. 2, several control signals are involved in the enabling and operation of the sense circuitry associated with memory array block $12a_1$. In this example, control signals SARW_ODD, SAE, BLPRCEN, SARW_EV, and LIOE are generated by control logic located elsewhere within memory 10, for example within global I/O block 16 as will be described in further detail below. To the extent that these control signals depend on the value of the received memory address, one or more of these control signals may instead be generated by address decoder 14 itself, or in combination with other control logic in memory 10 such as that within global I/O block 16.

Figure 3:
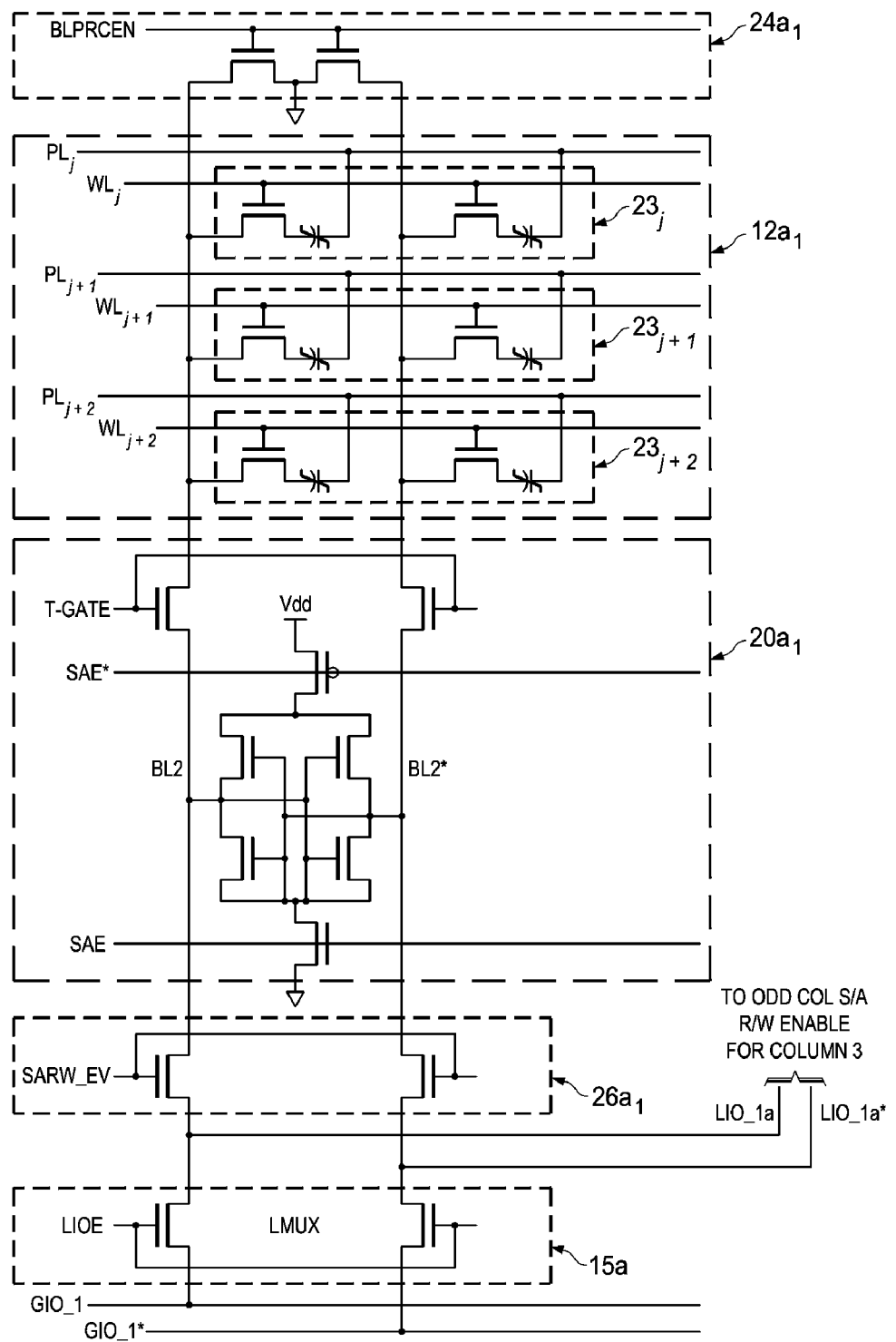
FIG. 3 is an electrical diagram, in schematic form, of a column in the sector and segment of FIG. 2, constructed according to embodiments of this invention.

FIG. 3 illustrates the construction of a representative column (column 2) and its sense circuitry in memory array block $12a_1$, for the example of FeRAM memory 10. In this example, three FeRAM cells $23_j$ through $23_{j+2}$ associated with rows j through j+2, respectively, are illustrated in connection with column 2; it will be of course understood by those skilled in the art that typically many more cells 23 will reside in column 2 and the other columns of memory array block $12a_1$. In the example of FIG. 3, each FeRAM cell 23 is constructed of the 2-T/2-C type, with one ferroelectric capacitor and pass transistor coupled to bit line BL2 and the other capacitor and transistor combination coupled to complementary bit line BL2*. Each of FeRAM cells $23_j$ through $23_{j+2}$ receive word line signals from word line driver $18_1$ on word lines $WL_j$ through $WL_{j+2}$, respectively, and plate line voltages from plate line driver $22a_1$ on plate lines $PL_j$ through $PL_{j+2}$, respectively, in the conventional manner. As known in the art for 2-T/2-C FeRAMs, bit lines BL2, BL2* carry complementary data levels in a write operation, and as such the two ferroelectric capacitors within each cell 23 are polarized to opposite states to differentially define the stored data state.

Bit line precharge circuitry $24a_1$ is coupled between complementary bit lines BL2, BL2* and a reference potential, such as ground. In the example of FIG. 3, bit line precharge circuitry $24a_1$ includes a transistor with its source/drain path connected between each of bit lines BL2, BL2* and ground, and its gate receiving control signal BLPRCEN. In operation, an active level on control signal BLPRCEN will turn on both transistors within bit line precharge circuitry $24a_1$, which precharges both bit lines BL2, BL2* to ground in this example. Of course, other precharge voltages may be used if desired.

FIG. 3 also illustrates the construction of the instance of even column sense amplifier $20a_1$ associated with column 2. In this example, sense amplifier $20a_1$ is constructed in the conventional cross-coupled CMOS inverter fashion, with enable transistors receiving complementary control signals SAE*, SAE from control logic. Bit lines BL2, BL2* are coupled to the sense nodes of sense amplifier $20a_1$ by a transfer gate that responds to control signal T-gate. On the opposite side of sense amplifier $20a_1$, the sense nodes of sense amplifier $20a_1$ are coupled to local I/O lines LIO_1a, LIO_1a* by transistors within even column sense amplifier read/write enable circuit $26a_1$, under the control of control signal SARW_EV. Local I/O lines LIO_1a, LIO_1a* are in turn coupled to global I/O lines GIO_1, GIO_1* by transistors in local multiplexer 15a that are controlled by control signal LIOE.

In operation, prior to a read operation, control signal BLPRCEN is driven to an active level to cause bit line precharge circuit $24a_1$ to connect bit lines BL2, BL2* to ground for a selected precharge duration, following which control signal BLPRCEN releases bit lines BL2, BL2*. To read FeRAM cell $23_j$, for example, word line $WL_j$ and $PL_j$ are then driven to the desired read levels (e.g., with plate line $PL_j$ pulsed above a ferroelectric transition voltage), such that the current ferroelectric state of the two capacitors within cell $23_j$ defines a differential charge or voltage across bit lines BL2, BL2*. Sense amplifier $20a_1$ is enabled to sense and amplify this differential state established on bit lines BL2, BL2* upon control signal T-gate coupling bit lines BL2, BL2* to the sense nodes, and upon control signals SAE*, SAE allowing the cross-coupled inverter sense amplifier to latch according to the differential bit line state. In this embodiment of the invention, the selected row of memory cells 23 in both the even-numbered and odd-numbered columns are simultaneously sensed, to minimize the overall cycle time and power consumption involved in the read/write operation. As such, at the time that the state of FeRAM $23_j$ in column 2 being sensed by sense amplifier $20a_1$, the state of other cells 23 in both even-numbered and odd-numbered columns are also being sensed by their corresponding sense amplifiers $20a_1$, $21a_1$. Alternatively, cells 23 in the even-numbered and odd-numbered columns may be sensed in separate portions of the cycle, but this lengthens the overall cycle time. In any case, after the sense operation is completed, control signal SARW_EV is driven active high so that even column sense amplifier read/write enable circuit $26a_1$ couples the sense nodes of sense amplifier $20a_1$ to local I/O lines LIO_1a, LIO 1a*, as do even column sense amplifier read/write enable circuit $26a_1$ for other even-numbered columns; during this time, odd column sense amplifiers $21a_1$ are isolated from their local I/O lines by corresponding odd column sense amplifier read/write enable circuits $27a_1$.

Because segment "a" is being accessed in this read operation, control signal LIOE is also driven active, causing local multiplexer 15a to couple local I/O lines LIO_1a, LIO_1a* to global I/O lines GIO_1, GIO_1*, thus forwarding a differential signal corresponding to the state of addressed cell $23_j$ in column 2 to global I/O block 16. Even though local I/O lines LIO_1a, LIO_1a* are also associated with paired odd column 3 in memory array block $12a_1$, the control signal SARW_ODD associated with odd columns remains inactive during this time, such that odd column sense amplifier read/write enable circuit $27a_1$ disconnects odd column sense amplifiers $21a_1$ from local I/O lines LIO_1a, LIO_1a*.

Conversely, write operations are performed in a similar manner, with the input data state to be written to the addressed cell 23 in column 2 of memory array block $12a_1$ established by global I/O block 16 on lines GIO_1, GIO_1*. Control signals LIOE, SARW_EV enable local multiplexer 15a and even column sense amplifier enable circuit $26a_1$ to couple the differential state of lines GIO_1, GIO_1* to sense amplifier $20a_1$ via local I/O lines LIO_1a, LIO_1a*. Active control signals SAE*, SAE, allow sense amplifier $20a_1$ to establish a full differential signal at its sense nodes, and to latch that state. In this example, while even column sense amplifier read/write enable circuit $26a_1$ is activated during this write operation, the sense nodes of even column sense amplifier $20a_1$ are decoupled from bitlines BL2, BL2* (control signal T-gate is inactive). Later, after odd column sense amplifiers 21a similarly latch their data states as subsequently presented on lines GIO, GIO*, control signal T-gate is asserted for both sense amplifiers banks 20a, 21a to transfer the latched data into the memory cells of the selected row, for both the even and odd columns simultaneously. For column 2 shown in FIG. 3, this operation allows sense amplifier $20a_1$ to present the state latched at its sense nodes onto bit lines BL2, BL2* (bit line precharge circuit $24a_1$ remains off). This differential level establishes the polarization state within the cell 23 within the row that receives the appropriate write levels on word line WL and the corresponding plate line PL, in the conventional manner.

Figure 4:
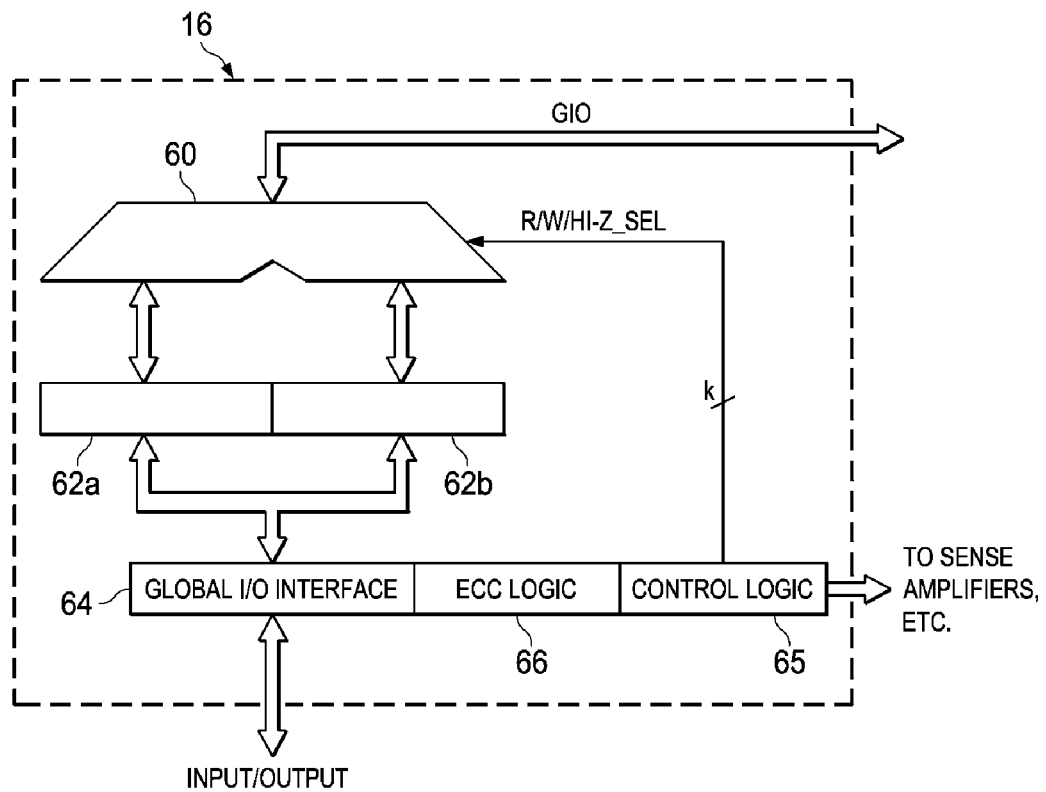
FIG. 4 is an electrical diagram, in block form, of the construction of a global input/output block in the memory of FIG. 1 according to an embodiment of this invention.

FIG. 4 illustrates a generalized construction of global I/O block 16, according to embodiments of this invention. As evident from the above description relative to FIGS. 1 through 3, odd-numbered and even-numbered columns within a given memory array block 12 share local I/O lines LIO, LIO* in a time-multiplexed manner, such that data transfer between global I/O block 16 and sense amplifiers 20, 21 associated with even-numbered and odd-numbered columns, respectively, is time-multiplexed. In this example, global I/O block 16 manages this time-multiplexing by way of multiplexer/demultiplexer 60, which receives global I/O bus GIO (constructed as differential signal lines for each bit, in this example). Mux/demux 60 is coupled on the other side to buffer 62, which has buffer portions 62a, 62b of the same bit width as that of global I/O bus GIO. Buffer 62 is coupled to global I/O interface 64, which communicates the contents of buffer 62 externally from memory 10, and which also receives input data to be stored in buffer 62 and written to memory 10. Error correction coding (ECC) logic 66 is also contained within global I/O block, for correcting any erred bits within each data word read from memory 10 by way of conventional ECC decoding of the payload portion of the read data word in combination with its ECC code bits, and also for generating ECC code bits for each data word written into memory 10 from received input data corresponding to the payload portion of that data word, in the conventional manner and according to the desired ECC code. The operation of mux/demux 60, as well as the generation of other control signals as applied to other circuitry within memory 10 such as the sense circuitry described above, is managed by control logic 65 in this example. According to these embodiments of the invention, control signals R/W/HI-Z_SEL to mux/demux 60 generated by control logic 65 include selection of the appropriate buffer portion 62a, 62b for communication with global I/O bus GIO, the direction of transfer (read or write), and also the ability to disconnect from global I/O bus GIO (placing global I/O bus GIO into a high-impedance, or "tri-state" condition). It is contemplated that those skilled in the art having reference to this specification will be readily able to construct and arrange control logic 65 and other control logic within memory 10, based on the description of the functions of memory 10 described herein.

According to the architecture of memory 10 described above, FeRAM cells 23 associated with the row selected according to the row portion of the received memory address, and resident in the enabled or selected segment, constitute an internal data word of a size corresponding to the size of buffer 62. As described above, odd column sense amplifiers 21 and even column sense amplifiers 20 are separately coupled to global I/O bus GIO, via the local I/O lines LIO, LIO* of the selected segment, in a time-multiplexed fashion. This time-multiplexed data communication greatly reduces the chip area required to realize memory 10, particularly in this case in which differential lines communicate each bit of a relatively wide internal data word.

Figure 5:
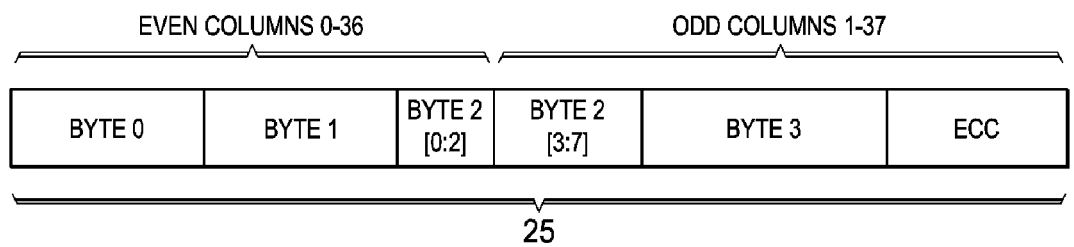
FIG. 5 is a register diagram illustrating the organization of data bytes in the memory of FIGS. 1 through 3 according to embodiments of this invention.

FIG. 5 illustrates the arrangement of data word 25 of memory 10 according to embodiments of this invention. In this example, data word 25 is thirty-eight bits wide. The payload portion of data word 25 is four bytes (byte 0 through byte 3) in size, and data word 25 also includes six additional bits for storing an ECC code value based on the contents of bytes 0 through 3, derived in the conventional manner. In order for ECC to be useful in memory 10 with this multi-byte data word organization, the entire internal data word of four bytes plus ECC information must be read even if only one byte is being retrieved, because the ECC value is based on the content of all four bytes of data word 25. Conversely, to write any single byte into memory 10, the entire data word of four bytes containing the new byte is typically written. Because the ECC value depends on the contents of all four bytes, ECC could have detected an error in the payload bytes read during a read operation, requiring all of corrected payload bytes, new bytes, and new ECC bits of data word 25 to be written in a write operation to memory 10.

In the arrangement of FIG. 5 for memory 10, the bits stored in even-numbered and odd-numbered columns are concatenated by global I/O block 16 into multi-byte data word 25. The nineteen bits stored in even-numbered columns 0 to 36 of the selected row constitute byte 0, byte 1, and the first three bits (bits 0:2, in "little-endian" order) of byte 2. The nineteen bits stored in odd-numbered columns 1 to 37 of the selected row constitute the last five bits (bits 3:7) of byte 2, byte 3, and the six ECC bits derived over all four bytes of the data word.

Conventional Read/Write Sequencing

By way of background, an example of the operation according to a conventional time-multiplexed read/write cycle of an instance of data word 25 to a selected row in a selected sector and segment of the architecture of memory 10 is shown in FIG. 6. The operations involved in receiving, decoding, and energizing the appropriate circuits within memory 10 follow the description provided above, and will be recognized by those skilled in the art having reference to this specification. In process 30, the contents of memory cells in both odd-numbered and even-numbered columns in the selected row are sensed by sense amplifiers. Applying this conventional method to an architecture such as that described above, process 30 includes the sensing of FeRAM cells 23 in the even-numbered columns of the selected row in the selected memory array block 12 by the appropriate sense amplifier bank 20, and the sensing of FeRAM cells 23 in the odd-numbered columns of the selected row in the selected memory array block 12 by the appropriate sense amplifier bank 21. In process 31, the sensed data states at even column sense amplifiers 20 are placed on the internal I/O bus of local I/O lines LIO, LIO* and global I/O bus GIO, and thus forwarded to global I/O block 16 for storage in buffer portion 62a via mux/demux 60. Similarly, in process 32, the sensed data states at odd column sense amplifiers 21 are placed onto the internal I/O bus of local I/O lines LIO, LIO* and global I/O bus GIO, and thus forwarded to global I/O block 16 for storage in buffer portion 62b. Following process 32, in this example, buffer 62 thus stores a full data word 25 arranged as shown in FIG. 5. Upon receipt of the full data word in buffer 62, ECC logic 65 performs a conventional error correction operation in process 34 to correct, to the extent possible, bit errors indicated by ECC decoding of the full data word.

The write operation following this data read operation in this example of the conventional method as applied to memory 10 begins with process 36, in which global I/O block 16 receives one or more input data bytes. Process 38 is then performed by ECC logic 65 to derive a new ECC value, based on the payload portion of the data word to be written, that payload portion including any newly-received input data. Upon completion of these processes 36, 38, buffer 62 contains the data word to be written into cells 23 in the same selected row of memory array block 12. In process 40, mux/demux 60 forwards the contents of buffer portion 62a to global I/O bus GIO, by way of which the even column sense amplifiers 20 receive and latch the data values for bytes 0, 1, and part of byte 2. In process 41, the write is completed by mux/demux 60 forwarding the contents of buffer portion 62b to global I/O bus GIO, by way of which the odd column sense amplifiers 21 receive and latch the data values for the remainder of byte 2, byte 3, and the ECC values. In process 42, the latched contents of sense amplifiers 20, 21 are applied to the corresponding bit lines, and set the data state in each of FeRAM cells 23 in the selected row, for both the odd and even numbered columns. The data word in the selected row of the selected memory array block 12 are thus read and written in this conventional operation.

It has been observed, in connection with this invention, that significant power is consumed by memory 10 in its switching of global I/O bus GIO according to this conventional approach of FIG. 6. This switching is shown in the timing diagram of FIG. 8a, by the transition of voltage levels of multiple lines of global I/O bus GIO at time $t_{30}$ at which process 30 of FIG. 6 takes place. At and after time $t_{31}$, global I/O bus GIO presents logic levels corresponding to the data states sensed in process 30 and applied to global I/O bus GIO, from even column sense amplifiers 20 of the selected memory array block 12 in process 31, those logic levels communicated to global I/O bus GIO by way of local I/O lines LIO, LIO* and local multiplexers 15 for the addressed segment. At time $t_{32}$ in FIG. 8a, the result of process 32 in applying the sensed data states for odd-numbered columns in the selected memory array block 12 appears on global I/O bus GIO. As described above for the example of this architecture, these odd-numbered columns include the contents of the ECC bits based on the contents of all bytes in the entire data word 25 sensed in process 30.

In processes 34, 36, and 38 described above relative to FIG. 6, erred bits are corrected via ECC decoding of data word 25, including its ECC bits forwarded in process 32, new data are received, and new ECC bits are generated for the modified data word 25. Global I/O block 16 then presents new data to be written to the selected row of the selected memory array block 12 onto bus GIO, beginning with the transition at time $t_{40}$ as shown in FIG. 8a, which presents the data to be communicated to the even-numbered columns of that row. These data are communicated via local multiplexers 15 and local I/O lines LIO, LIO* to even column sense amplifiers 20 in the manner described above. At time $t_{42}$, global I/O block 16 presents the data for the odd-numbered columns in the selected row onto global I/O bus GIO, that data including the ECC bits that will be stored by some of the odd-numbered columns in the addressed block.

It has been observed, according to this invention, that substantial power is consumed according to this conventional approach at each transition of the internal I/O bus of local I/O lines LIO and global I/O bus GIO. As shown in FIG. 8a, the levels of lines in local I/O lines LIO and global I/O bus GIO depend on the state of the previous operation, which in this conventional case corresponds to the data read from the odd-numbered columns of the selected row. At time $t_{40}$, process 40 is writing the data for the even-numbered columns in that selected row to the internal I/O bus. Those data written in process 40 are independent, on a bit-by-bit basis, from the data read from the odd-numbered columns in preceding process 32. As such, on the average, 50% of the lines within local I/O lines LIO and global I/O bus GIO will be making a full logic level transition at about time $t_{40}$, even if the data being written to the even-numbered columns in process 40 are identical to the data previously read from those columns in process 30. Especially in multiple-segment memory architectures such as that shown in FIG. 1, the parasitic load presented by global I/O bus GIO can be substantial, such as on the order of several hundred fF to several pF. Significant power is consumed in driving these conductors to different logic levels. For example, on the average, 50% of the internal I/O bus conductors will make a transition, with half of those (25% of the whole) making a low-to-high transition that consumes significant power.

Read/Write Sequencing According to Embodiments of the Invention

According to this invention, memory 10 is constructed and operated to reduce the likelihood of voltage transitions in performing a page mode read-write operation. In particular, it is contemplated that control logic 65, or control logic elsewhere within memory 10 as desired, will be constructed so as to carry out the read/write sequencing and associated operations according to these embodiments of this invention, an example of which will now be described relative to FIG. 7. It is contemplated that those skilled in the art having reference to this specification will be readily able to implement such control logic or other circuitry and functionality for performing and controlling these operations, in a manner suitable for particular implementations, without undue experimentation.

FIG. 7 is a flow diagram illustrating the operation of a page mode read and write to the even and odd column sense amplifier banks associated with a selected row of memory cells in a selected memory array block according to an embodiment of this invention, for the example in which the odd-numbered and even-numbered columns constitute a data word according to the example of data word 25 in FIG. 5. As known in the art, page mode refers to a mode of memory access in which multiple accesses are sequentially made to a group of data elements within the context of a single "cycle". In the architecture of memory 10 described in this specification, page mode access is performed sequentially with respect to an internal I/O bus constituted by global I/O lines GIO and those local I/O lines LIO associated with the selected memory array block 12, with the sequential read and write operations being made relative to even column sense amplifiers 20 and odd column sense amplifiers 21. In this architecture, because of the generation of the ECC value over the multiple data bytes that are accessed within a page mode cycle, all ECC accesses to the memory may necessarily be performed in page mode, in which case the invocation of page mode is implied by any memory access. In other architectures, page mode operation must be invoked by way of a control signal, a sequence of external clocks (e.g., row address strobe held low for the duration of multiple column address strobe cycles), or the like. In any event, the operation described below in connection with FIG. 7 occurs after page mode operation of memory 10 has been invoked by the method appropriate for the architecture.

According to this embodiment of the invention, the page mode access begins with process 43, in which the cells 23 in both the odd-numbered and even-numbered columns in the selected row of the selected memory array block 12 are sensed by corresponding sense amplifiers 21, 20, respectively. As known in the art, this process 43 includes energizing of the word line WL associated with the selected row by one of word line drivers 18 associated with the memory array block 12, according to the row portion of the memory address received by address decoder 14. Similarly, the corresponding plate line PL for the selected row is biased by plate line drivers 22 as appropriate for this operation. After the sensing of cells 23 in the selected row, process 44 is performed by sense amplifier read/write enable circuit 27 then coupling the sense nodes of odd column sense amplifier bank 21 to local I/O lines LIO, LIO*, and by local multiplexer bank 15 coupling those local I/O lines LIO, LIO* to global I/O bus GIO. From global I/O bus GIO, the odd-numbered column data, including the ECC bits for the entire data word (FIG. 5) in this example, are transferred to registers 62b in global I/O block 16. Process 46 is then performed to place the sensed data states of the even-numbered columns of the selected row, at sense nodes of even column sense amplifier bank 20, onto global I/O bus GIO, carried out by sense amplifier read/write enable circuit 26 and local multiplexer bank 15 as described above for process 44. From global I/O bus GIO, these even-numbered column data are transferred to registers 62a in global I/O block 16.

Those skilled in the art should recognize that the particular assignment of odd- and even-numbered columns in this example shown in FIG. 7 is not in and of itself essential to the invention. However, because the ECC bit values are derived over the entire data word, including bits in both even- and odd-numbered columns, the ECC bits will change each time that any bit or bits in the data word receive new data. According to this embodiment of the invention, as will become evident from this description, maximum power savings may be attained by ensuring that the first group of columns read by this process is the group containing the ECC bits, whether resident in odd- or even-numbered columns.

According to this embodiment of the invention, upon receipt by buffer 62 in global I/O block 16 (FIG. 4) of the data values from the even-numbered columns of the selected row as presented in process 46, the internal I/O bus constituted of local I/O bus LIO (collectively referring to all local I/O lines LIO, LIO* for the selected block 12) and global I/O bus GIO is placed into a high-impedance, or "tri-state", condition in process 48. As known in the art, this tri-state condition means that the conductors of this internal I/O bus are not driven to a particular voltage, but are permitted to float. According to the architecture described above, control logic 65 in global I/O block 16 controls mux/demux 60 to float, i.e. not drive or bias, the data lines of global I/O bus GIO; in addition, control logic 65 or some other control logic in memory 10 also causes local multiplexer banks 15 (or such other circuitry on the array end of global I/O bus GIO) to similarly float, or not drive, the conductors in global I/O bus GIO. In this example, no charge or discharge path is connected to these conductors in global I/O bus GIO, and as such the logic levels present on these conductors at the end of process 46 will remain, at least for some time. Similarly, the local I/O bus LIO (collectively referring to all local I/O lines LIO, LIO*) associated with the selected memory array block 12 is floated by control signals SARW_EV, SARW_OD, LIOE being turned off (inactive), which electrically isolates its local I/O lines LIO, LIO* from being driven. Alternatively, "keepers" or other small drive circuits may be provided and controlled to assist in maintaining the states of these conductors in global I/O bus GIO, and/or local I/O lines LIO, LIO*, at the same level as at the end of process 48.

While global I/O bus GIO and local I/O bus LIO remains in tri-state as a result of process 48, processes 50, 52, 54 are carried out by global I/O block 16. In process 50, ECC logic 66 performs ECC decoding of the contents of data word 25 stored in buffer 62, to determine whether any bit errors are present; if so, and if possible, ECC logic 66 corrects the erroneous bits in the conventional manner according to the particular ECC code being used. The contents of this data word 25 may be output, if desired, via global I/O interface 64. In process 52, if not earlier, one or more bytes of input data are received by global I/O interface 64 from external to memory 10 and loaded into buffer 62. In process 54, ECC logic 66 generates new values of ECC bits for data word 25 using the input bytes received in process 54 and the contents of data word 25 that are not being written (and thus remain in buffer 62). Following process 54, buffer 62 contains the contents of data word 25 to be written to the selected row in the selected memory array block 12, including any modified data bits or bytes and the new value of the ECC bits generated in process 54.

In process 56, mux/demux 60 presents the bits from buffer portion 62a corresponding to the even-numbered columns of the selected row onto global I/O bus GIO for writing into the corresponding even column sense amplifiers 20 for the selected memory array block 12. As described above, these logic levels are communicated to local I/O lines LIO, LIO* of the selected memory array block 12 by way of the corresponding local multiplexer bank 15 receiving control signal LIOE at an active level. Control logic 65 (in combination with address decoder 14, if appropriate) energizes control signal SARW_EV to even column sense amplifier read/write enable circuit 26 for the selected memory array block 12, communicating the differential levels at local I/O lines LIO, LIO* to even-column sense amplifier bank 20. These sense amplifiers 20 then amplify the signal on local I/O lines LIO, LIO*, and latch the amplified logic levels; during that time, the sense nodes of sense amplifiers 20 are isolated from the bit lines by control signal T-gate being inactive low. Because the even-numbered columns were read last (relative to the odd-numbered columns) but are being written first, and because of the tri-state condition into which the internal I/O bus was placed in process 48, little or no switching power is required to be applied to local I/O bus LIO and global I/O bus GIO for those bits of the even-numbered columns that are not being changed by write process 56.

Following process 56, input data for the odd-numbered columns including the ECC bits are then latched into odd column sense amplifiers 21 for the selected memory array block 12, in process 58. This is accomplished in a similar manner as described above for the even-numbered columns, by control logic 65 controlling mux/demux 60 to apply logic levels corresponding to the appropriate buffer portion 62b for the odd-numbered columns onto global I/O bus GIO, with these levels in turn communicated by local multiplexers 15 to local I/O lines LIO, LIO* of the selected memory array block 12 in response to control signal LIOE. Control logic 65 (in combination with address decoder 14, if appropriate) energizes control signal SARW_ODD to odd column sense amplifier read/write enable circuit 27 for the selected memory array block 12, communicating those differential levels to odd-column sense amplifier bank 21, which in turn is enabled to amplify and latch those levels at corresponding sense nodes (which are isolated, during that time, from the bit lines by control signal T-gate being inactive).

According to this embodiment of the invention, process 59 is then performed to transfer the data latched into both even column sense amplifier bank 20 and odd column sense amplifier bank 21 to FeRAM cells 23 for the selected row in the selected memory array block 12. This transfer is accomplished via the transfer gates of sense amplifiers 20, 21, made conductive by control logic 65 asserting an active level of control signal T-gate. The combination of the bit line voltages with the appropriate voltages on the selected word line WL and plate line PL results in the data states being stored in cells 23 of the selected row in the selected memory array block 12. This completes the page mode read and write operation of data word 25 in the selected row of memory 10.

As mentioned above, the specific assignment of odd- and even-numbered columns to the particular order of operation according to this invention is not of particular importance. But according to this embodiment of the invention, the group of columns containing the ECC bits (the odd-numbered columns in this example) is read first (process 44) and written last (process 58). Meanwhile, the group of columns that does not contain the ECC bits (the even-numbered columns in this example) is the last group read (process 46) and the first group written (process 56). This ordering of the read and write processes reduces the power consumed in many memory access cycles, as will now be described in connection with FIGS. 8b and 8c.

FIG. 8b is a timing diagram illustrating the operation of data transitions collectively on the conductors of global I/O bus GIO in the operation described above in connection with FIG. 7, according to this embodiment of the invention, while FIG. 8c is a timing diagram for a single conductor GIO_k of that data bus during those operations. At time $t_{44}$ of FIGS. 8b and 8c, read process 44 is performed, with the odd-numbered column data bits, including the ECC bits, appearing on global I/O bus GIO. For the case of conductor GIO_k, the associated logic level is a "0" in this example, as shown in FIG. 8c. At time $t_{46}$, the sensed data levels associated with the even-numbered columns of the selected row are presented on global I/O bus GIO as a result of process 46; conductor GIO_k in this example is driven to a logic "1" level in this example. Following both read processes 44, 46 in this case, process 48 is then performed, placing global I/O bus GIO into its tri-state condition by operation of mux/demux 60, local multiplexers 15, and sense amplifier read/write enable circuits 26, 27, in this embodiment of the invention. No transition occurs on global I/O bus GIO at this time, as especially evident by conductor GIO_k remaining at its high level following time $t_{48}$ as shown in FIG. 8c. These logic levels maintained on global I/O bus GIO after time $t_{48}$ are not driven to these levels, as described above; rather, in this embodiment of the invention, the conductors of global I/O bus GIO are electrically floating, and do not discharge nor are driven to a different logic level during processes 48, 50, 52, 54. Alternatively, as mentioned above, small "keeper" devices may be provided to maintain these levels without consuming significant power.

Beginning at time $t_{56}$, the input data associated with the even-numbered columns of the selected row are written to even column sense amplifier bank 20 via global I/O bus GIO and local I/O bus LIO, in process 56 as described above. The ECC bits are not included in this group of columns, as described above. But because these even-numbered columns are the most recently read columns, with global I/O bus GIO and local I/O bus LIO floating in the interim time (i.e., in the "tri-state" condition), those bits of the even-numbered columns that are not changing data state will require little or no power to be driven to the previous logic level. This is evident in the case of conductor GIO_k shown in FIG. 8c, which remains at the same "1" level following time $t_{56}$ to which it was driven in process 46 at time $t_{46}$ (and at which it remained while floating following time $t_{48}$). Following the writing of even-numbered column data in process 56, process 58 is then carried out, in which logic levels for the odd-numbered columns are driven onto global I/O bus GIO, as shown in FIGS. 8b and 8c following time $t_{58}$, resulting in these data being latched into corresponding odd column sense amplifier bank 21 via local I/O bus LIO for the selected memory array block 12. Following process 58, as discussed above, the even and odd column data are written by sense amplifiers 20, 21 into cells 23 in the selected row of the selected memory array block 12 (not shown in FIGS. 8b and 8c).

As discussed above, according to this embodiment of the invention, the power consumed in switching the logic levels of global I/O bus GIO and local I/O bus LIO conductors will be reduced, on the average over many cycles, from that required according to the conventional page mode read and write operations described relative to FIG. 7. This reduction in power consumption is especially evident with wide data words, such as data word 25 including four data bytes plus ECC bits as shown in FIG. 5. In such wide data words, often only one byte is being written at a time. However, in architectures such as memory 10 described above, ECC is applied over a larger data word including the newly-written byte, to minimize the chip area required for the memory cells storing the ECC code bits. In these architectures, the writing of new data for even one byte will require generation of the ECC bits for the entire data word, which of course requires the reading and buffering of the data word, correcting any error bits read as indicated by the ECC results, and then generating the new ECC bits over the entire data word and rewriting the entire data word, as described above.

This embodiment of the invention takes advantage of those cycles in which one or more data bytes in a data word do not change state as another byte in that data word is written with new data. Referring back to FIG. 5 for the example of data word 25, if byte 3 is the only byte in an instance of data word that is rewritten, then only the odd-numbered columns will contain changed data, specifically corresponding to the bits of byte 3 and the ECC bits. The same data states read from even column sense amplifiers 20 will be written back into those even column sense amplifiers 20, subject, of course, to any bits that are corrected as a result of ECC during the read operation. According to this embodiment of the invention, because sense amplifiers 20 for the even-numbered columns are the last read (process 46) but the first written (process 56), with global I/O bus GIO and local I/O bus LIO in tri-state between those times (process 48), none of the conductors of global I/O bus GIO and local I/O bus LIO change state in accomplishing the write operation of process 56. The logic levels on these conductors upon completion of process 46 at time $t_{46}$ (FIGS. 8b and 8c) remain on those conductors through process 56 (i.e., following time $t_{56}$).

In contrast, referring to the conventional operation illustrated in FIGS. 6 and 8a, the data for the odd- and even-numbered columns alternate on global I/O bus GIO. Because these data are independent from one another on a bit-by-bit basis, the chance that a given conductor of global I/O bus GIO makes a transition between read and write processes (times $t_{30}$, $t_{32}$, $t_{40}$, $t_{42}$ of FIG. 8a) is 50%. Even if the data written to the even-numbered columns remain the same as that read in the same operation, a 50% probability of transition is still present, because the writing of the even-numbered columns (process 40) follows the reading of the odd-numbered columns (process 32). Power is also required to drive the transitions of local I/O bus LIO in this case, as well.

In this preferred embodiment of the invention described above, the ECC bits are included within the group of columns that are read first and written last (e.g., the odd-numbered columns in this example). This association is because the ECC value will change even if a single byte within data word changes; in other words, the ECC value will change from its read value in each write operation. Accordingly, minimization of switching power consumption is attained by reading the group of columns containing the ECC bits first, and writing that group of columns last. On the average, the occurrence of transitions at time $t_{56}$ is less than 50%.

Alternatively, power can still be saved according to this invention in other embodiments of this invention in which the ECC bits are not all included within the group of columns that are read first and written last. Even if the ECC bits are in part or totally included within the group of columns that are read last and written first, the other columns in that group corresponding to the payload still have a less than 50% (i.e., less than random) chance of making a transition from the read state to the write state. In contrast, according to the conventional approach in which the group of columns last read differs from the group of columns first written, the chance of a given conductor making a transition is essentially random (50%), because the data states are independent from one another on a bit-by-bit basis. Further in the alternative, if no ECC is included within the data word at all, power consumption remains minimized by ensuring that the group of columns last read are also the group of columns first written.

Switching power is reduced according to the preferred embodiment of the invention described above, even if one of the bytes within the even-numbered columns is being written with different data than its previous contents. For example, if byte 0 in data word 25 of FIG. 5 is being rewritten while bytes 1 and 2 will be written with the same data, only eight of the nineteen conductors of global I/O bus GIO and local I/O bus LIO for the selected memory array block 12 will have a 50% chance of transition at time $t_{56}$ (FIGS. 8b and 8c) as write process 56 is being performed; the conductors of global I/O bus GIO corresponding to byte 1 and the first three bits of byte 2 will remain at the same logic level as read in process 46 by virtue of the operation of this invention. As such, the probability of a logic transition on global I/O bus GIO is about 21%, in contrast to the 50% probability according to the conventional read and write sequence. Power is thus saved by operation of this embodiment of the invention in this situation, especially if considered over a large number of cycles.

Of course, the actual power savings will depend on the overall number and frequency of accesses to memory 10, and the number of bytes written within the data word width within that population of accesses. The power savings will be less as the number of bytes per data word written increases, but will increase if a large fraction of the accesses involve single-byte writes.

According to embodiments of this invention, therefore, the benefits of a multiplexed internal data bus (e.g., global I/O bus GIO) in reducing the chip area required for routing conductors for memory access can be attained, while minimizing the power consumption required to carry out the multiplexed access. The reduced power consumption is especially significant in modern memories in which the memory array is arranged in multiple "segments" that share the same internal data bus, as the necessary length of the internal data bus in such a realization presents a significant parasitic load, and thus requires substantial energy to switch that load from one state to another, particularly at high switching rates. This reduction in power consumption and efficient chip area utilization are especially important in battery-powered electronic devices and systems, including mobile communications devices and implantable medical devices.

In embodiments of this invention described above, separate sense amplifier banks and sense amplifier read/write circuits are coupled to adjacent sectors. For example, FIG. 1 shows even sense amplifier bank 20 and even sense amplifier read/write enable circuit bank 26, for sector 0, as separate from the odd sense amplifier bank 21 and odd sense amplifier read/write enable circuit bank 27, for sector 1. Alternatively, to save area, single instances of sense amplifier bank and sense amplifier read/write enable circuit bank can be used, with appropriate switches used to couple these circuits to one sector at a time.

Embodiments of this invention are described for the case of 2-T/2-C FeRAM cells. However, it is contemplated that other types of FeRAM cells, for example 1-T/1C can alternatively be used.

In the embodiments of the invention described above, complementary pairs of local and global input/output lines transfer data between the sense amplifiers and the global I/O block. However, it is also contemplated that other embodiments of this invention can utilize single lines for the local I/O bus and/or for the global I/O bus, for data transfer between the sense amplifiers and the I/O block.

It is contemplated that those skilled in the art having reference to this specification will recognize various alternative realizations of these embodiments of the invention, in which these important advantages will still be retained. For example, it is contemplated that various error correction and detection schemes may be used, and arranged within each data word in a manner suitable for particular applications yet utilizing the invention described in this specification. It is further contemplated that more than two groups of columns may be read and written in a time-multiplexed manner within a given page mode cycle, within the scope of this invention. In short, while this invention has been described according to various embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory device, comprising:
    at least one memory array block including a plurality of memory cells arranged in rows and columns;
    a first sense circuitry bank associated with a first group of columns of the at least one memory array block;
    a second sense circuitry bank associated with a second group of columns of the at least one memory array block;
    an internal data bus of a bit width corresponding to a number of columns in one of the groups of columns;
    input/output circuitry coupled to the internal data bus, for arranging the contents of the first and second groups of columns sensed by the first and second sense circuitry banks into a data word comprised of a payload portion and an error correction coding (ECC) portion including an ECC value based on the contents of the payload portion, and for receiving input data corresponding to at least a portion of the data word;
    error correction coding (ECC) logic for generating ECC values based on the contents of the payload portion of data words; and
    control logic, for controlling the input/output circuitry, ECC logic, and the first and second sense circuitry banks to perform a read/write sequence of a data word in a selected row of the at least one memory array block according to a plurality of operations comprising:
        receiving input data to be stored;
        enabling the first and second sense circuitry banks to sense data states stored in memory cells of the first and second group of columns, respectively, in a selected row of the at least one memory array block;
        coupling the sensed data states from the first sense circuitry bank to the input/output circuitry via the internal data bus;
        then coupling the sensed data states from the second sense circuitry bank to the input/output circuitry via the internal data bus;
        generating the ECC value for a data word to be stored in the selected row, the data word including the received input data and the generated ECC value;
        then coupling, to the internal data bus, a portion of the data word to be stored in memory cells of the second group of columns in the selected row; and
        then coupling, to the internal data bus, a portion of the data word to be stored in memory cells of the first group of columns in the selected row.

2. The memory of claim 1, wherein the error correction coding (ECC) logic is also for decoding a data word including a payload portion and an ECC value;
    wherein the sequence of operations further comprises:
        after the operation of enabling the first and second sense circuitry banks to sense data states stored in memory cells, then decoding the data word stored in the memory cells of the first and second groups of columns in the selected row of the at least one memory array block to correct one or more bit errors in the data word, if present.

3. The memory of claim 1, wherein the memory cells are of the ferroelectric type.

4. The memory of claim 1, wherein the at least one memory array block comprises a plurality of memory array blocks arranged in a plurality of segments;
    further comprising:
        a plurality of sets of local input/output lines, each set associated with at least one of the memory array blocks in one of the plurality of segments;

a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments, and wherein the sequence of operations further comprises:
after the operation of coupling the sensed data states from the second sense circuitry bank to the internal data bus, and before the operation of coupling data to be stored in memory cells of the second group of columns in the selected row to the internal data bus, placing the set of local input/output lines associated with the segment including the memory array block having the selected row in a high-impedance state.

5. The memory of claim 1, wherein the at least one memory array block comprises a plurality of memory array blocks arranged in a plurality of segments;
further comprising:
a plurality of sets of local input/output lines, each set associated with at least one of the memory array blocks in one of the plurality of segments;
a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments; and
circuitry for maintaining the set of local input/output lines associated with the segment including the memory array block having the selected row, at its levels after the operation of coupling the sensed data states from the second sense circuitry bank to the internal data bus, before the operation of coupling data to be stored in memory cells of the second group of columns in the selected row to the internal data bus.

6. The memory of claim 1, wherein one of the first and second groups of columns corresponds to odd-numbered columns of the at least one memory array block, and the other of the first and second groups of columns corresponds to even-numbered columns of the at least one memory array block.

7. The memory of claim 1, wherein the ECC value of the data word is included in the data states stored in memory cells of the first group of columns and sensed by the first sense circuitry bank.

8. The memory of claim 1, wherein the at least one memory array block comprises a plurality of memory array blocks arranged in a plurality of segments;
and further comprising:
a plurality of sets of local input/output lines, each set associated with at least one of the memory array blocks in one of the plurality of segments;
a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments.

9. The memory of claim 8, wherein each of the plurality of segments includes a plurality of memory array blocks arranged in sectors, each sector corresponding to a range of row address values.

10. The memory of claim 1, further comprising:
a first sense circuitry read/write enable circuit for coupling the first sense circuitry bank to the internal data bus;
a second sense circuitry read/write enable circuit for coupling the second sense circuitry bank to the internal data bus;
wherein the operation of coupling the sensed data states of the first group of columns in the selected row of the at least one memory array block to the internal data bus comprises enabling the first sense circuitry read/write enable circuit;
wherein the operation of coupling the sensed data states of the second group of columns in the selected row of the at least one memory array block to the internal data bus comprises enabling the second sense circuitry read/write enable circuit;
and wherein the sequence of operations further comprises:
in combination with the operation of coupling data to be stored in memory cells of the second group of columns in the selected row to the internal data bus, enabling the second sense circuitry read/write enable circuit to forward the data to be stored to the second sense circuitry bank for writing to those memory cells; and
in combination with the operation of coupling data to be stored in memory cells of the first group of columns in the selected row to the internal data bus, enabling the first sense circuitry read/write enable circuit to forward the data to be stored to the first sense circuitry bank for writing to those memory cells.

11. The memory of claim 10, wherein the at least one memory array block comprises a plurality of memory array blocks arranged in a plurality of segments;
and further comprising:
a plurality of sets of local input/output lines, each set associated with at least one of the memory array blocks in one of the plurality of segments;
a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments;
wherein the first sense circuitry read/write enable circuit is for coupling the first sense circuitry bank to the local input/output lines;
and wherein the second sense circuitry read/write enable circuit is for coupling the second sense circuitry bank to the local input/output lines.

12. The memory of claim 1, wherein the sequence of operations further comprises:
after the operation of coupling the sensed data states from the second sense circuitry bank to the internal data bus, and before the operation of coupling data to be stored in memory cells of the second group of columns in the selected row to the internal data bus, placing the internal data bus in a high-impedance state.

13. The memory of claim 12, wherein the at least one memory array block comprises a plurality of memory array blocks arranged in a plurality of segments;

and further comprising:
 a plurality of sets of local input/output lines, each set associated with at least one of the memory array blocks in one of the plurality of segments;
 a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments.

14. The memory of claim 13, wherein the operation of placing the internal data bus in a high-impedance state also places the set of local input/output lines associated with the segment including the memory array block having the selected row.

15. The memory of claim 1, further comprising:
 circuitry for maintaining the internal data bus at its levels after the operation of coupling the sensed data states from the second sense circuitry bank to the internal data bus, before the operation of coupling data to be stored in memory cells of the second group of columns in the selected row to the internal data bus.

16. The memory of claim 15, wherein the at least one memory array block comprises a plurality of memory array blocks arranged in a plurality of segments;

and further comprising:
 a plurality of sets of local input/output lines, each set associated with at least one of the memory array blocks in one of the plurality of segments;
 a plurality of local multiplexers, each local multiplexer associated with one of the plurality of segments, and for coupling the set of local input/output lines associated with its segment to the internal data bus for a read/write sequence of a data word in a selected row of a memory array block in its segment, and for isolating the set of local input/output lines associated with its segment from the internal data bus for a read/write sequence to a memory array block in other segments.

17. The memory of claim 16, wherein the maintaining circuitry also maintains levels of the set of local input/output lines associated with the segment including the memory array block having the selected row, after the operation of coupling the sensed data states from the second sense circuitry bank to the internal data bus, and before the operation of coupling data to be stored in memory cells of the second group of columns in the selected row to the internal data bus.

18. A method of performing a read and write access to a solid-state memory, the memory comprising at least one memory array block including a plurality of memory cells arranged in rows and columns, the method comprising the steps of:
 sensing stored data states of memory cells in first and second groups of columns in a selected row of a memory array block, the stored data states constituting a data word comprising a payload portion and an error correction coding (ECC) portion for an ECC value based on the payload portion;
 receiving input data to be written to at least a portion of an instance of the data word;
 communicating the stored data states from the first group of columns to an internal data bus;
 after the step of communicating the stored data states from the first group of columns, then communicating the stored data states from the second group of columns to the internal data bus;
 generating an ECC value for the instance of the data word including the received input data;
 after the steps of communicating the stored data states from the second group of columns and of generating the ECC value, then applying, to the internal data bus, data states to be written to memory cells in the second group of columns in the selected row of the memory array block; and
 then applying, to the internal data bus, data states to be written to memory cells in the first group of columns in the selected row of the memory array block.

19. The method of claim 18, further comprising:
 after the step of communicating the stored data states from the second group of columns to the internal data bus, decoding the data word corresponding to the sensed stored data states of memory cells in the first and second groups of columns in the selected row of the memory array block to correct one or more bit errors in the data word, if present.

20. The method of claim 18, wherein the ECC value is included in the sensed stored data states of memory cells in the first group of columns in the selected row of the memory array block.

21. The method of claim 18, further comprising:
 after the step of applying data states to the internal bus to be written to memory cells in the second group of columns, coupling the internal bus to a second bank of sense amplifiers corresponding to the second group of columns so that the data states are latched into the second bank of sense amplifiers;
 after the step of applying data states to the internal bus to be written to memory cells in the first group of columns, coupling the internal bus to a first bank of sense amplifiers corresponding to the first group of columns so that the data states are latched into the first bank of sense amplifiers; and
 then coupling the first and second banks of sense amplifiers to bit lines of the at least one memory array block so that the data states are written into corresponding memory cells in the selected row.

22. The method of claim 21, wherein the memory cells are of the ferroelectric type;
 and further comprising:
  during the step of coupling the first and second banks of sense amplifiers to bit lines of the at least one memory array block, applying a plate line voltage to those memory cells to write the data states into the memory cells.

23. The method of claim 18, wherein the at least one memory array block comprises a plurality of memory array blocks arranged in a plurality of segments, each segment associated with one of a set of local input/output lines;
 wherein the step of communicating the stored data states from the first group of columns comprises:
  coupling outputs of a first sense amplifier bank corresponding to the first group of columns to a set of local input/output lines; and
  enabling a local multiplexer to couple the set of local input/output lines to the internal data bus;

and wherein the step of communicating the stored data states from the second group of columns comprises:
coupling outputs of a second sense amplifier bank corresponding to the second group of columns to a set of local input/output lines; and
enabling the local multiplexer to couple the set of local input/output lines to the internal data bus.

24. The method of claim 23, further comprising:
after the step of communicating the stored data states from the second group of columns, and before the step of applying, to the internal data bus, data states to be written to the second group of columns, placing the set of local input/output lines into a high-impedance state.

25. The method of claim 23, further comprising:
maintaining the set of local input/output lines at its levels after the step of communicating the stored data states from the second group of columns, and before the step of applying, to the internal data bus, data states to be written to the second group of columns.

26. The method of claim 23, wherein the plurality of memory array blocks are also arranged in a plurality of sectors, each sector corresponding to a range of row address values, and each segment including memory array blocks in each of the plurality of sectors;
and wherein the memory array blocks in a sector are associated with a common set of local input/output lines.

27. The method of claim 18, further comprising:
after the step of communicating the stored data states from the second group of columns, and before the step of applying, to the internal data bus, data states to be written to the second group of columns, placing the internal data bus into a high-impedance state.

28. The method of claim 27, wherein the at least one memory array block comprises a plurality of memory array blocks arranged in a plurality of segments, each segment associated with one of a set of local input/output lines;
wherein the step of communicating the stored data states from the first group of columns comprises:
coupling outputs of a first sense amplifier bank corresponding to the first group of columns to a set of local input/output lines; and
enabling a local multiplexer to couple the set of local input/output lines to the internal data bus;
wherein the step of communicating the stored data states from the second group of columns comprises:
coupling outputs of a second sense amplifier bank corresponding to the second group of columns to a set of local input/output lines; and
enabling the local multiplexer to couple the set of local input/output lines to the internal data bus.

29. The method of claim 28, wherein the step of placing the internal data bus in a high-impedance state also places the set of local input/output lines into the high impedance state.

30. The method of claim 18, further comprising:
maintaining the internal data bus at its levels after the step of communicating the stored data states from the second group of columns, and before the step of applying, to the internal data bus, data states to be written to the second group of columns.

31. The method of claim 30, wherein the at least one memory array block comprises a plurality of memory array blocks arranged in a plurality of segments, each segment associated with one of a set of local input/output lines;
wherein the step of communicating the stored data states from the first group of columns comprises:
coupling outputs of a first sense amplifier bank corresponding to the first group of columns to a set of local input/output lines; and
enabling a local multiplexer to couple the set of local input/output lines to the internal data bus;
wherein the step of communicating the stored data states from the second group of columns comprises:
coupling outputs of a second sense amplifier bank corresponding to the second group of columns to a set of local input/output lines; and
enabling the local multiplexer to couple the set of local input/output lines to the internal data bus.

32. The method of claim 31, wherein the maintaining step also maintains levels of the set of local input/output lines after the step of communicating the stored data states from the second group of columns, and before the step of applying, to the internal data bus, data states to be written to the second group of columns.

* * * * *